United States Patent
Fang et al.

(10) Patent No.: US 10,340,322 B2
(45) Date of Patent: Jul. 2, 2019

(54) DISPLAY DEVICE AND ORGANIC LIGHT EMITTING DIODE (OLED) DISPLAY PANEL

(71) Applicant: Shenzhen China Star Optoelectronics Semiconductor Display Technology Co., Ltd., Shenzhen (CN)

(72) Inventors: Chunhsiung Fang, Shenzhen (CN); Yuanchun Wu, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 15/579,955

(22) PCT Filed: Nov. 16, 2017

(86) PCT No.: PCT/CN2017/111296
§ 371 (c)(1),
(2) Date: Dec. 6, 2017

(65) Prior Publication Data
US 2019/0115408 A1    Apr. 18, 2019

(30) Foreign Application Priority Data
Oct. 18, 2017   (CN) .......................... 2017 1 0970745

(51) Int. Cl.
| H01L 27/32 | (2006.01) |
| H01L 49/02 | (2006.01) |
| H01L 51/50 | (2006.01) |
| H01L 51/52 | (2006.01) |
| H01L 27/12 | (2006.01) |

(52) U.S. Cl.
CPC ...... *H01L 27/3265* (2013.01); *H01L 27/3246* (2013.01); *H01L 27/3262* (2013.01); *H01L 28/60* (2013.01); *H01L 51/5072* (2013.01); *H01L 51/5221* (2013.01); *H01L 27/1255* (2013.01); *H01L 27/3248* (2013.01)

(58) Field of Classification Search
CPC ............. H01L 27/1255; H01L 27/3246; H01L 27/3248; H01L 27/3262; H01L 27/3265; H01L 28/60; H01L 51/5072; H01L 51/5221

See application file for complete search history.

(56) References Cited

U.S. PATENT DOCUMENTS

| 2009/0079029 A1* | 3/2009 | Chen ................... H01L 23/5223 257/532 |
| 2013/0026475 A1* | 1/2013 | Choi ................... H01L 27/1255 257/59 |
| 2013/0313529 A1* | 11/2013 | Kim ................... H01L 27/1255 257/40 |
| 2016/0247870 A1* | 8/2016 | Park ................... H01L 27/3265 |

(Continued)

*Primary Examiner* — Allan R Wilson
(74) *Attorney, Agent, or Firm* — Mark M. Friedman

(57) ABSTRACT

This application provides a display device and an OLED display panel. The display device comprises a storage capacitor. A part of a source and drain metal layer is a first electrode of a storage capacitor. A cathode layer is a second electrode of the storage capacitor. An electron transmitting functional layer, a passivation layer, and an inorganic pixel defining layer arranged between the first electrode and the second electrode are the dielectric materials of the storage capacitor.

7 Claims, 2 Drawing Sheets

(56) References Cited

U.S. PATENT DOCUMENTS

| | | | | |
|---|---|---|---|---|
| 2016/0300864 A1* | 10/2016 | Seo | ............... | H01L 27/1255 |
| 2017/0148861 A1* | 5/2017 | Kim | ............... | H01L 27/3211 |
| 2017/0179211 A1* | 6/2017 | Kanaya | ............ | H01L 27/3246 |
| 2018/0013086 A1* | 1/2018 | Chou | ............... | G02F 1/1345 |

* cited by examiner

DISPLAY DEVICE AND ORGANIC LIGHT EMITTING DIODE (OLED) DISPLAY PANEL

CROSS REFERENCE TO RELATED APPLICATION

This application claims the priority of International Application No. PCT/CN2017/111296, filed on 2017 Nov. 16, which claims priority to Chinese Application No. 201710970745.4, filed on 2017 Oct. 18. The entire disclosures of each of the above applications are incorporated herein by reference.

BACKGROUND OF INVENTION

Field of Invention

The present invention relates to flat panel displays, and particularly to a display device and an OLED display panel.

Description of Prior Art

In flat panel display technology, OLED displays have many advantages such as thin, active light, fast response time, wide viewing angles, wide color range, high brightness, and low power consumption, and will be third generation display technology after liquid crystal display (LCD) device. Compared with LCD device, OLEDs have many advantages such as more power savings, thinner, and wide viewing angles, which LCDs do not have. Now that users require higher resolutions, how to produce good quality and high resolution OLEDs is problematic.

OLEDs can be divided into passive matrix OLEDs and active matrix OLEDs according to drivers. Conventional active matrix OLEDs comprise two transistors and a storage capacitor arranged between the two transistor. FIG. 1 is a structural diagram of a conventional active matrix OLED, where the OLED display panel comprises a thin film transistor layer and an OLED display layer 10, and the thin film transistor layer comprises a thin film transistor switching area 20, a thin film transistor driving area 30, and a storage capacitor. FIG. 2 is an equivalent circuit diagram of FIG. 1, where a storage capacitor Cst is arranged between a thin film transistor T1 and a thin film transistor T2. Both the thin film transistors T1 and T2 are field effect transistors. The thin film transistor T1 is a switching signal transistor, and is configured for transmitting and disconnecting a digital signal. The thin film transistor T2 is a driving transistor, and is connected to an organic light emitting diode D. In detail, a gate electrode of the switching signal transistor T1 receives a scanning signal $V_{gate}$, a source electrode receives a digital signal $V_{data}$, and a drain electrode is connected to a gate electrode of the driving transistor T2. A source electrode of the driving transistor T2 is connected to a source $V_{dd}$, a drain electrode is connected to an anode of the organic light emitting diode D. A cathode of the organic light emitting diode D is earthed. The storage capacitor Cst is connected between the drain electrode of the switching signal transistor T1 and the source electrode of the driving transistor T2.

Working principle of the circuit is when the scanning digital $V_{gate}$ comes, the switching signal transistor T1 is conducted, the digital signal $V_{data}$ enters into the gate electrode of the driving transistor T2 and is increased by the driving transistor T2 to drive the organic light emitting diode D to display. When the scanning digital ends, the storage capacitor Cst is used to maintain electric potential of the driving transistor T2 in gate node, increasing the storage capacitor to improve view uniformity and promote display quality. Conventional storage capacitor consists of a gate electrode metal, a source and drain electrode metal, and an insulating layer arranged between the gate electrode metal and the source and drain electrode metal, or consists of a source and drain electrode metal, a pixel electrode, and an insulating layer arranged between the source and drain electrode metal and the pixel electrode. A storage capacitor of FIG. 1 consists of a gate electrode metal, a source and drain electrode metal, and a insulating layer arranged between the gate electrode metal and the source and drain electrode metal, too many gate electrodes and gate lines formed on the thin film transistor layer occupies too much of an area to limit maximum resolution of the conventional display device and reduce aperture of a product having a high resolution.

SUMMARY OF INVENTION

The application provides display device and an OLED display panel to avoid a problem of too many areas occupied by an array structure of storage capacitors in a conventional display device where a maximum resolution of the conventional display device is limited.

For the above-mentioned objective, the present disclosure employs the following technical schemes.

A display device, comprises:
a substrate;
a first buffer layer formed on the substrate;
an insulating layer formed on the first buffer layer;
a first metal layer formed on a surface of the insulating layer, wherein the first metal layer is a first electrode of a storage capacitor of the display device;
at least one inorganic film layer formed on a surface of the first metal layer;
a conducting layer formed on a surface of the inorganic film layer;
a second metal layer formed on a surface of the conducting layer, wherein the second metal layer is a second electrode of the storage capacitor; and
wherein the storage capacitor comprises an opening formed in a pixel defining layer and a flattening layer corresponding to the first metal layer, the conducting layer and the second metal layer are formed in the opening and on the inorganic film layer.

In one exemplary embodiment, the method for manufacturing the TFT array substrate further comprises:
an organic light emitting diode (OLED) layer; and
wherein the first metal layer is a part of a source and drain electrode metal layer of a switching area of a thin film transistor, the inorganic film layer is a passivation layer, the conducting layer is an electron transporting layer of the OLED layer, and the second metal layer is a cathode layer of the OLED layer.

In one exemplary embodiment, in the method for manufacturing the TFT array substrate, the opening of the storage capacitor is formed in the flattening layer and the inorganic film layer to expose the first metal layer, an inorganic pixel defining layer and the pixel defining layer are deposited in the opening and on the first metal layer, a part of the pixel defining layer in the opening is stripped to expose the inorganic pixel defining layer, and the conducting layer and the second metal layer are deposited in the opening and on the inorganic pixel defining layer.

In one exemplary embodiment, in the method for manufacturing the TFT array substrate, the first metal layer is a source and drain electrode metal layer of a thin film transistor layer, the inorganic film layer is the inorganic pixel defining layer, the conducting layer is an electron transporting layer of the OLED layer, and the second metal layer is a cathode layer of the OLED layer.

An OLED display panel comprising a display device and a thin film transistor layer, wherein the display device further comprises:
a substrate;
a first buffer layer formed on the substrate;
an insulating layer formed on the first buffer layer;
a first metal layer formed on a surface of the insulating layer, wherein the first metal layer is a first electrode of a storage capacitor of the display device;
at least one inorganic film layer formed on a surface of the first metal layer;
a conducting layer formed on a surface of the inorganic film layer; and
a second metal layer formed on a surface of the conducting layer, wherein the second metal layer is a second electrode of the storage capacitor.

In one exemplary embodiment, in the OLED display panel, the storage capacitor comprises an opening formed in a pixel defining layer and a flattening layer corresponding to the first metal layer, the conducting layer and the second metal layer are formed in the opening and on the inorganic film layer.

In one exemplary embodiment, the OLED display panel further comprises:
an organic light emitting diode (OLED) layer; and
wherein the first metal layer is a part of a source and drain electrode metal layer of a switching area of a thin film transistor, the inorganic film layer is a passivation layer, the conducting layer is an electron transporting layer of the OLED layer, and the second metal layer is a cathode layer of the OLED layer.

In one exemplary embodiment, in the OLED display panel, the opening of the storage capacitor is formed in the flattening layer and the inorganic film layer to expose the first metal layer, an inorganic pixel defining layer and the pixel defining layer are deposited in the opening and on the first metal layer, a part of the pixel defining layer in the opening is stripped to expose the inorganic pixel defining layer, and the conducting layer and the second metal layer are deposited in the opening and on the inorganic pixel defining layer.

In one exemplary embodiment, in the OLED display panel, the first metal layer is a source and drain electrode metal layer of a thin film transistor layer, the inorganic film layer is the inorganic pixel defining layer, the conducting layer is an electron transporting layer of the OLED layer, and the second metal layer is a cathode layer of the OLED layer.

A display device, comprises:
a substrate;
a first buffer layer formed on the substrate;
an insulating layer formed on the first buffer layer;
a first metal layer formed on a surface of the insulating layer, wherein the first metal layer is a first electrode of a storage capacitor of the display device;
at least one inorganic film layer formed on a surface of the first metal layer;
a conducting layer formed on a surface of the inorganic film layer; and a second metal layer firmed on a surface of the conducting layer, wherein the second metal layer is a second electrode of the storage capacitor.

In one exemplary embodiment, the display device further comprises:
an organic light emitting diode (OLED) layer; and
wherein the first metal layer is a part of a source and drain electrode metal layer of a switching area of a thin film transistor, the inorganic film layer is a passivation layer, the conducting layer is an electron transporting layer of the OLED layer, and the second metal layer is a cathode layer of the OLED layer.

In one exemplary embodiment, in the display device, the storage capacitor comprises an opening formed in the flattening layer and the inorganic film layer to expose the first metal layer, an inorganic pixel defining layer and the pixel defining layer are deposited in the opening and on the first metal layer, a part of the pixel defining layer in the opening is stripped to expose the inorganic pixel defining layer, and the conducting layer and the second metal layer are deposited in the opening and on the inorganic pixel defining layer.

In one exemplary embodiment, in the display device, the first metal layer is a source and drain electrode metal layer of a thin film transistor layer, the inorganic film layer is the inorganic pixel defining layer, the conducting layer is an electron transporting layer of the OLED layer, and the second metal layer is a cathode layer of the OLED layer.

The beneficial effect of this invention is: compared with the prior art, in this application, a source and drain metal layer of a part of a thin film transistor layer is a first electrode of a storage capacitor of a display device, a cathode layer of an OLED display layer is a second electrode of the storage capacitor, an electron transporting layer, a passivation layer, or a inorganic pixel defining layer is formed between the first electrode and the second electrode, an arranged place of the storage capacitor coincides with an array lines of the thin film transistor in this new type storage capacitor to improve a free degree of lines arranged in the display device, to increase an aperture, and to obtain a display device with a high resolution.

BRIEF DESCRIPTION OF THE DRAWINGS

In order to describe clearly the embodiment in the present disclosure or the prior art, the following will introduce the drawings for the embodiment shortly. Obviously, the following description is only a few embodiments, for the common technical personnel in the field it is easy to acquire some other drawings without creative work.

DETAILED DESCRIPTION OF THE PREFERRED EMBODIMENTS

Figure 1:
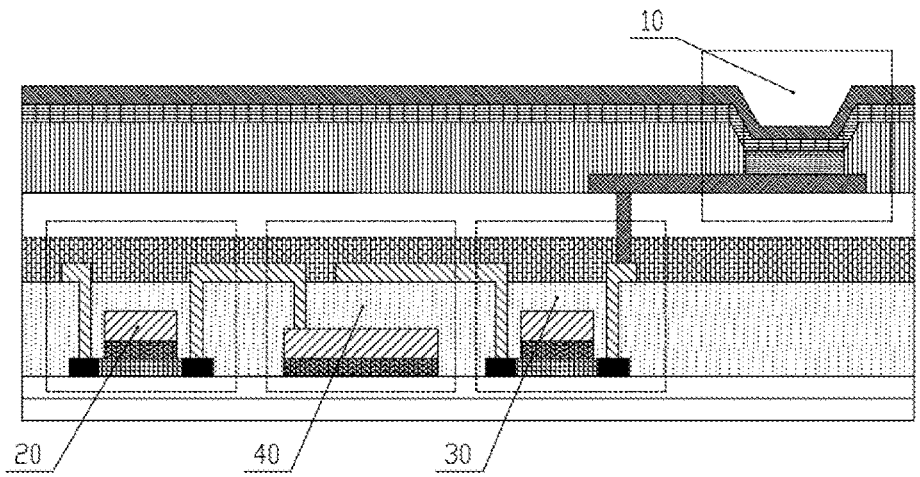
FIG. 1 is a structure diagram of a film layer of a conventional OLED display panel.
Figure 2:
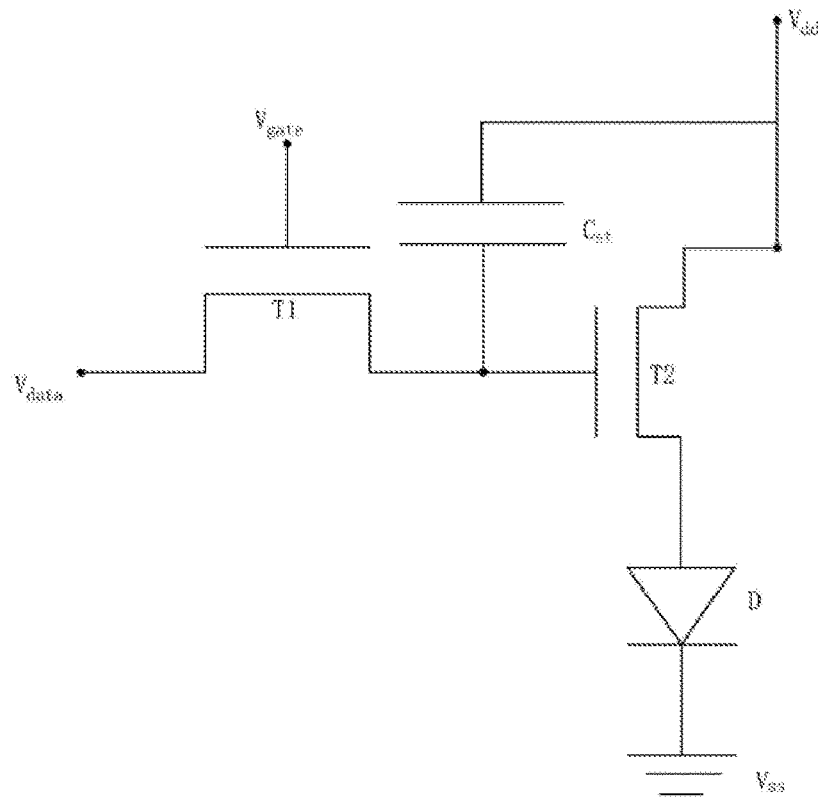
FIG. 2 is an equivalent circuit diagram of a conventional OLED display panel.

The description of following embodiment, with reference to the accompanying drawings, is used to exemplify specific embodiments which may be carried out in the present disclosure. Directional terms mentioned in the present disclosure, such as "top", "bottom", "front", "back", "left", "right", "inside", "outside", "side", etc., are only used with reference to the orientation of the accompanying drawings. Therefore, the used directional terms are intended to illustrate, but not to limit, the present disclosure. In the drawings, the components having similar structures are denoted by same numerals.

This application avoids a problem of too many areas occupied by first electrodes of storage capacitor made by too many gate electrodes and gate lines formed on the thin film transistor layer in a conventional display device, where maximum resolution of the conventional display device is limited, and aperture of a high resolution product is reduced.

Figure 3:
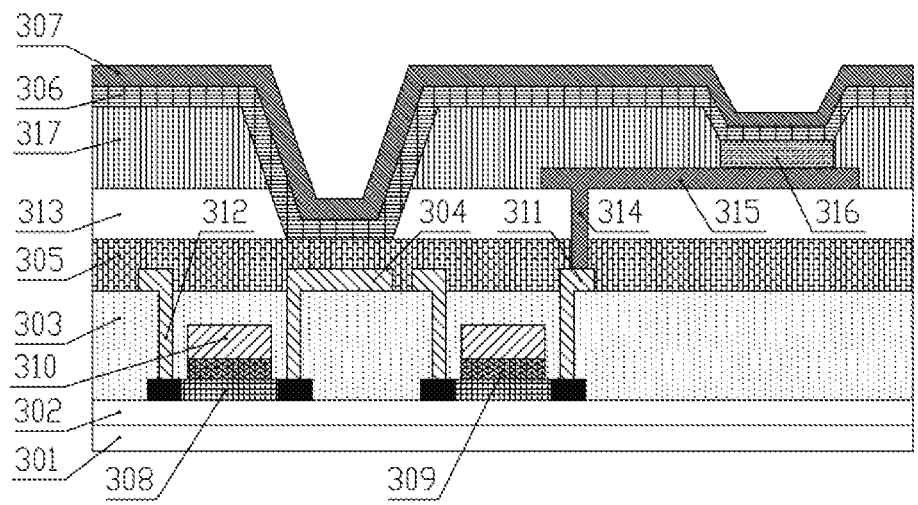
FIG. 3 is a structure diagram of a film layer of a display device according to a first exemplary embodiment of the present disclosure.

FIG. 3 is a structure diagram of a film layer of a display device according to a first exemplary embodiment of the present disclosure. The display device comprises a thin film transistor switching area, a thin film transistor driving area, and a storage capacitor.

Referring to FIG. 3, the display device comprises a substrate 301, a first buffer layer 302, an insulating layer 303, a first metal layer 304, at least one inorganic film layer 305, a conducting layer 306, and a second metal layer 307.

In this exemplary embodiment, the first buffer layer 302 and the insulating layer 303 are formed on the substrate 301. This first buffer layer 302 can be an oxide film, such as silicon dioxide, and the oxide can be insulator.

The insulating layer 303 can be a protecting layer. The insulating layer 303 covers the thin film transistor switching area and the thin film transistor driving area. The thin film transistor switching area, and the thin film transistor driving area comprise an active layer 308, a gate insulating layer 309, a gate electrode layer 310, the insulating layer 303, and a source and drain electrode layer 311.

The active layer 308 is formed on the first buffer layer 302. In this exemplary embodiment, the active layer 308 can be a metal oxide film, such as indium gallium zinc oxide, the oxide is a semiconductor. A predetermined graph can be formed in the active layer 308 by mask process.

The active layer 308 comprises a first active layer area and a second active layer area. The first active layer area is generated by a predetermined process of a part of the active layer active layer 308 acting with a reactive metal. In this exemplary embodiment, the predetermined process is a high temperature annealing process. The high temperature annealing process can be carried out in an aerobic environment or an oxygen-free environment. A temperature range of the high temperature annealing process is from 200 □ to 400 □.

Further, during the high temperature annealing process, an un-stripped reactive metal is acted with an un-covered active layer active layer 308 by the gate insulating layer 309, the reactive metal is acted with oxygen of the active layer 308 to generated a metal oxide corresponding to the reactive metal. Oxygen vacancies are generated by the active layer 308 losing the oxygen to reduce a resistor of the active layer 308, an acted part of the active layer 308 is changed from a semiconductor to a conductor to form the first active layer area. The second active area layer is an un-acted part.

The gate insulating layer 309 is formed on the active layer 308. In this exemplary embodiment, the gate insulating layer 309 is made of silicon nitride, and can be made of silicon oxide and silicon nitrous oxide, etc.

The gate electrode layer 310 is formed on the gate insulating layer 309. The gate electrode layer 310 can be formed on the gate insulating layer 309 by a magnetron sputtering process. Metal of the gate electrode layer 310 can be one or the combination of molybdenum, aluminum, aluminum nickel alloy molybdenum tungsten alloy, chromium, or copper etc.

The insulating layer 303 is formed on a surface of the gate electrode layer 310. The insulating layer 303 covers the gate electrode layer 310, the gate insulating layer 309, and the active layer 308 to insulate between the gate electrode layer 310 and the source and drain electrode layer 311.

A through hole 312 of the insulating layer can be formed by etching, the source and drain electrode layer 311 is electrically connected to the first active layer area by the through hole 312.

Metal of the source and drain electrode layer 311 is same as that of the gate electrode layer 310. A part of the source and drain electrode layer 311 is the first metal layer 304 of the storage capacitor of the display device and is a first electrode of the storage capacitor.

The passivation layer is formed on the source and drain metal layer. The passivation is an inorganic film layer 305. The passivation layer can be made of silicon nitride. The passivation layer is a dielectric material arranged between the first electrode and the second electrode. The inorganic film layer 305 can be a multilayered structure.

The flattening layer 313 is firmed on the passivation layer. The flattening layer 313 can be patterned by lithography or photography process, and the passivation layer is etched to form a first hole 314. The source and drain metal layer of the thin film transistor driving area is electrically connected to the anode 315 of the OLED display layer by the first metal layer 304.

The display device further comprises an OLED display. A anode 315 of the OLED display is formed on the passivation layer. The anode 315 is patterned to form at least two anodes arranged as an array structure. The anode 315 is used for hole to receive electron. The anode 315 can be made of transparent materials for light passing.

The light emitting layer 316 is formed on the anode 315. The light emitting layer 316 is patterned to form at least two light emitting units separated with each other. Each light emitting unit corresponds to each anode. The anode 315 is made of organic semiconductor with a special electronic band structure, which can receive electrons coming from the anode and emit photons with a certain wave, and the photons enters into eyes to make us see colors.

The pixel defining layer 317 is formed on the anode 315 and covers the anode 315 and the passivation layer. In the mask process, at the same time, an opening is defined in the pixel defining layer 317 corresponding to the light emitting layer 316 and an opening is defined in the flattening layer 313 and the pixel defining layer 317 corresponding to the first metal layer 304, after cured at a high temperature, the conducting layer 306 and the second metal layer 307 are deposited.

In this exemplary embodiment, the second metal layer 307 is a cathode layer of the OLED display. The conducting layer 306 is an electron transmitting functional layer. The second metal layer 307 is the second electrode of the storage capacitor.

The electron transmitting functional layer is formed on the pixel defining layer 317. The electron transmitting can comprise a material layer, and can comprise more than or equal to two material layers. In this exemplary embodiment, the electron transmitting functional layer comprises an electron injecting layer and an electron transmitting layer arranged away from the anode 315 in sequence. The electron injecting layer and the electron transmitting layer are arranged near each other and are collectively called as the electron transmitting functional layer.

The cathode layer is a low work function alloy and generates electrons in a certain voltage. The electrons pass through the electron injecting layer and the electron transmitting layer and acts with the holes. In this exemplary embodiment, the cathode layer is made of materials with a high reflectivity.

A part of the source and drain electrode layer 311 is the first electrode of the storage capacitor. The cathode layer is the second electrode of the storage capacitor. The passivation layer 305 arranged between the first electrode and the second electrode is the dielectric materials of the storage capacitor.

Figure 4:
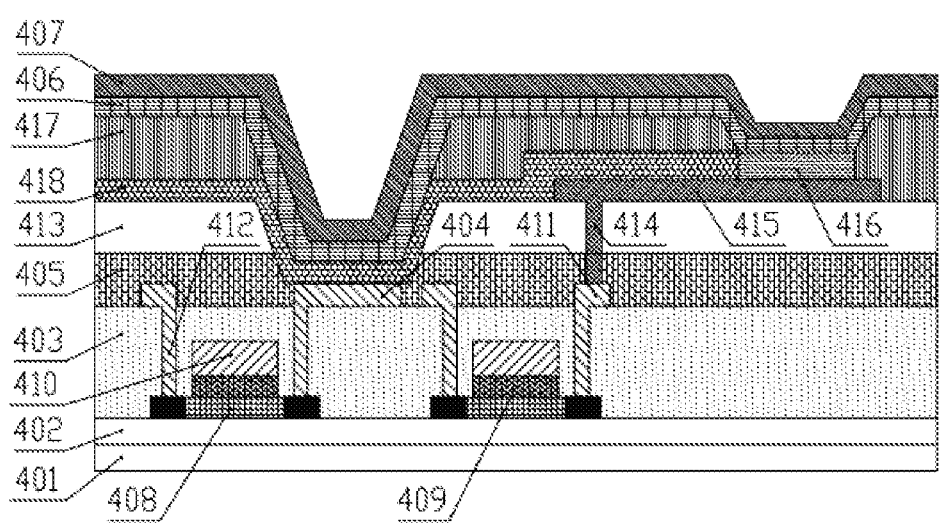
FIG. 4 is a structure diagram of a film layer of a display device according to a second exemplary embodiment of the present disclosure.

FIG. 4 is a structure diagram of a film layer of a display device according to a second exemplary embodiment of the present disclosure. The display device comprises a substrate 401, a first buffer layer 402, a insulating layer 403, a first metal layer 404, at least one inorganic film layer 405, a conducting layer 406, and a second metal layer 407.

A film structure of the thin film transistor of the second exemplary embodiment is same as the film structure of the thin film transistor of the first exemplary embodiment. Both the thin film transistor switching area and a thin film transistor driving area comprise an active layer 408, a gate insulating layer 409, a gate electrode layer 410, the insulating layer 403, and a 411.

After forming the flattening layer 413, the first hole is formed and electrically connected between the source and drain metal layer of the thin film transistor driving area and the anode 415 of the OLED display layer. The flattening layer 413 is patterned by lithography or photography process corresponding to the first metal layer 404. After cured at a high temperature, the inorganic film layer 405 is etched to form an opening to expose the first metal layer 404.

After forming the anode 415, the insulating layer 418 is deposited on the substrate 401. A part of the insulating layer 418 arranged on a surface of the 416 is stripped. The pixel defining layer 417, the conducting layer 406, and the second metal layer 407 are deposited. Material of the insulating layer 418 is same as material of the first buffer layer 402 of the second exemplary embodiment, such as silicon dioxide.

The same as the first exemplary embodiment, the conducting layer 406 is the electron transmitting functional layer of the OLED display layer, and the second metal layer 407 is the cathode layer of the OLED display layer.

In this exemplary embodiment, the storage capacitor comprises a part of the 411 being the first electrode of the storage capacitor, a cathode layer being the second electrode of the storage capacitor, and the insulating layer 418 arranged between the first electrode and the second electrode being the dielectric materials of the storage capacitor.

In a conventional technology, too many areas are occupied by first electrodes of the storage capacitor made by too many gate electrodes and gate lines formed on the thin film transistor layer, the maximum resolution of the conventional display device is limited, and an aperture of a product with a high resolution is reduced.

In this application, a source and drain metal layer of a part of a thin film transistor layer is a first electrode of a storage capacitor of a display device, a cathode layer of an OLED display layer is a second electrode of the storage capacitor, an electron transporting layer, a passivation layer, or a inorganic pixel defining layer is formed between the first electrode and the second electrode, an arranged place of the storage capacitor coincides with an array lines of the thin film transistor in this new type storage capacitor to improve a free degree of lines arranged in the display device, to increase an aperture, and to obtain a display device with a high resolution.

This application further provides an OLED display panel. The OLED display panel comprises a display device and a thin film transistor layer. The display device comprises a substrate, a first buffer layer, an insulating layer, a first metal layer, at least one inorganic film layer, a conducting layer, and a second metal layer, The specific embodiment of the invention is the same as that of the first and second exemplary embodiments, which is no longer detailed here.

This application provides a display device and an OLED display panel. The OLED display panel comprises the display device. The display device comprises a substrate, a first buffer layer, an insulating layer, a first metal layer, at least one inorganic film layer, a conducting layer, and a second metal layer. A part of a source and drain metal layer is a first electrode of a storage capacitor. A cathode layer is a second electrode of the storage capacitor. An electron transmitting functional layer, a passivation layer, and an inorganic pixel defining layer arranged between the first electrode and the second electrode are the dielectric materials of the storage capacitor. An arranged place of the storage capacitor coincides with an array lines of the thin film transistor in this new type storage capacitor to improve a free degree of lines arranged in the display device, to increase an aperture and to obtain a display device with a high resolution.

The present disclosure is described in detail in accordance with the above contents with the specific preferred examples. However, this present disclosure is not limited to the specific examples. For a person of ordinary skill in the art, on the premise of keeping the conception of the present disclosure, the technical personnel can also make simple deductions or replacements, all of which should be considered to belong to the protection scope of the present disclosure.

What is claimed is:

1. A display device, comprising:
   a substrate;
   a first buffer layer formed on the substrate;
   an insulating layer formed on the first buffer layer;
   a first metal layer formed on a surface of the insulating layer, wherein the first metal layer is a first electrode of a storage capacitor of the display device;
   at least one inorganic film layer formed on a surface of the first metal layer;
   a conducting layer formed on a surface of the inorganic film layer;
   a second metal layer formed on a surface of the conducting layer, wherein the second metal layer is a second electrode of the storage capacitor; and
   an organic light emitting diode (OLED) layer;
   wherein the storage capacitor comprises an opening formed in a pixel defining layer and a flattening layer corresponding to the first metal layer, the conducting layer and the second metal layer are formed in the opening and on the inorganic film layer, the first metal layer is a part of a source and drain electrode metal layer of a switching area of a thin film transistor, the inorganic film layer is a passivation layer, the conducting layer is an electron transporting layer of the OLED layer, and the second metal layer is a cathode layer of the OLED layer.

2. The display device of claim 1, wherein the first metal layer is a source and drain electrode metal layer of a thin film transistor layer, the inorganic film layer is an inorganic pixel defining layer, the conducting layer is an electron transporting layer of the OLED layer, and the second metal layer is a cathode layer of the OLED layer.

3. An organic light emitting diode (OLED) display panel comprising a display device and a thin film transistor layer, wherein the display device further comprises:
a substrate;
a first buffer layer formed on the substrate;
an insulating layer formed on the first buffer layer;
a first metal layer formed on a surface of the insulating layer, wherein the first metal layer is a first electrode of a storage capacitor of the display device;
at least one inorganic film layer formed on a surface of the first metal layer;
a conducting layer formed on a surface of the inorganic film layer;
a second metal layer formed on a surface of the conducting layer, wherein the second metal layer is a second electrode of the storage capacitor;
an organic light emitting diode (OLED) layer; and
wherein the first metal layer is a part of a source and drain electrode metal layer of a switching area of a thin film transistor, the inorganic film layer is a passivation layer, the conducting layer is an electron transporting layer of the OLED layer, and the second metal layer is a cathode layer of the OLED layer.

4. The OLED display panel of claim 3, wherein the storage capacitor comprises an opening formed in a pixel defining layer and a flattening layer corresponding to the first metal layer, the conducting layer and the second metal layer are formed in the opening and on the inorganic film layer.

5. The OLED display panel of claim 4, wherein the first metal layer is a source and drain electrode metal layer of a thin film transistor layer, the inorganic film layer is an inorganic pixel defining layer, the conducting layer is an electron transporting layer of the OLED layer, and the second metal layer is a cathode layer of the OLED layer.

6. A display device, comprising:
a substrate;
a first buffer layer formed on the substrate;
an insulating layer formed on the first buffer layer;
a first metal layer formed on a surface of the insulating layer, wherein the first metal layer is a first electrode of a storage capacitor of the display device;
at least one inorganic film layer formed on a surface of the first metal layer;
a conducting layer formed on a surface of the inorganic film layer;
a second metal layer formed on a surface of the conducting layer, wherein the second metal layer is a second electrode of the storage capacitor;
an organic light emitting diode (OLED) layer; and
wherein the first metal layer is a part of a source and drain electrode metal layer of a switching area of a thin film transistor, the inorganic film layer is a passivation layer, the conducting layer is an electron transporting layer of the OLED layer, and the second metal layer is a cathode layer of the OLED layer.

7. The display device of claim 6, wherein the first metal layer is a source and drain electrode metal layer of a thin film transistor layer, the inorganic film layer is an inorganic pixel defining layer, the conducting layer is an electron transporting layer of the OLED layer, and the second metal layer is a cathode layer of the OLED layer.

* * * * *